US012123905B2

(12) United States Patent
Ives et al.

(10) Patent No.: US 12,123,905 B2
(45) Date of Patent: Oct. 22, 2024

(54) COMMON MODE CURRENT FEED FAULT PROTECTION

(71) Applicant: Hamilton Sundstrand Corporation, Charlotte, NC (US)

(72) Inventors: Kyle Stephen Ives, Loves Park, IL (US); Tom A. Utecht, Cherry Valley, IL (US); Michael C. Harke, DeForest, WI (US)

(73) Assignee: Hamilton Sundstrand Corporation, Charlotte, NC (US)

( * ) Notice: Subject to any disclaimer, the term of this patent is extended or adjusted under 35 U.S.C. 154(b) by 225 days.

(21) Appl. No.: 17/836,225

(22) Filed: Jun. 9, 2022

(65) Prior Publication Data

US 2023/0400496 A1    Dec. 14, 2023

(51) Int. Cl.
*G01R 31/08* (2020.01)
*G05F 1/66* (2006.01)
*H02J 3/46* (2006.01)
*H02M 5/458* (2006.01)

(52) U.S. Cl.
CPC ............. *G01R 31/085* (2013.01); *G05F 1/66* (2013.01); *H02J 3/46* (2013.01); *H02M 5/4585* (2013.01); *H02J 2310/44* (2020.01)

(58) Field of Classification Search
CPC ............. G01R 31/085; G05F 1/66; H02J 3/46
See application file for complete search history.

(56) References Cited

U.S. PATENT DOCUMENTS

| 5,654,859 | A  | 8/1997  | Shi |
| 8,305,723 | B2 | 11/2012 | Vedula et al. |
| 8,531,804 | B2 | 9/2013  | Weems, II et al. |
| 8,873,207 | B2 | 10/2014 | Dillig et al. |
| 9,046,560 | B2 | 6/2015  | Li |
| 9,588,535 | B2 | 3/2017  | Solodovnik et al. |

(Continued)

FOREIGN PATENT DOCUMENTS

| CN | 110261713 A   | 9/2019 |
| JP | 2012078289 A  | 4/2012 |

(Continued)

OTHER PUBLICATIONS

Extended European Search Report issued in corresponding European Patent Application No. 23176535.5 on Oct. 27, 2023. Nov. 2, 2023.

(Continued)

*Primary Examiner* — Scott Bauer

(57) ABSTRACT

A system includes a generator. Three AC feeders are connected for feeding AC output from the generator. A rectifier is electrically connected to the three AC feeders and to a load via a first DC feeder and a second DC feeder. A first resistor connects between a the first DC feeder and ground. A second resistor connects between the second DC feeder and ground. At least one of a first current sensor is operatively connected to detect current in the first DC feeder and/or a second current sensor is operatively connected to detect current in the second DC feeder. A controller is configured to monitor for changes in common mode current based on the input from the at least one current sensor, and to determine presence of a fault if change in the common mode current exceeds a predetermined threshold.

20 Claims, 2 Drawing Sheets

(56) References Cited

U.S. PATENT DOCUMENTS

| | | |
|---|---|---|
| 9,912,310 B2 | 3/2018 | Saloio, Jr. et al. |
| 9,997,955 B1* | 6/2018 | Ross .................. H02J 1/108 |
| 10,585,134 B2 | 3/2020 | Kell et al. |
| 11,275,107 B2 | 3/2022 | Sevel et al. |
| 2009/0184717 A1 | 7/2009 | Ivan et al. |
| 2009/0303759 A1* | 12/2009 | Petersson ............ H02J 3/36 |
| | | 363/35 |
| 2014/0210208 A1* | 7/2014 | Wai .................... B60L 50/13 |
| | | 290/45 |
| 2017/0084414 A1* | 3/2017 | Rozman ............. H01H 83/02 |
| 2020/0223313 A1 | 7/2020 | Ishida |

FOREIGN PATENT DOCUMENTS

| | | |
|---|---|---|
| JP | 6757836 B1 | 9/2020 |
| KR | 20100104139 A | 9/2010 |
| KR | 101090263 B1 | 12/2011 |

OTHER PUBLICATIONS

Extended European Search Report dated Nov. 2, 2023, issued during the prosecution of European Patent Application No. EP 23177952.1.

* cited by examiner

COMMON MODE CURRENT FEED FAULT PROTECTION

BACKGROUND

1. Field

The present disclosure relates to ground fault protection for electrical systems, and more particularly to fault protection for systems such as aircraft.

2. Description of Related Art

Traditional constant frequency or variable frequency AC generation systems on aircraft have a neutral connection which is brought out of the generator and tied to ground. If an electrical feeder in the distribution system became shorted to ground, large amounts of current would flow back to the generator through the airframe. This type of historical electrical system grounding topology enabled adequate current sourcing levels and applied associated current sensing functionality for the fault to be detected and isolated by generation/distribution equipment controllers.

To reduce aircraft weight on future applications, electrical system designs are continuing to expand utilization of high voltage DC generation and distribution at +/−270 Vdc or +/−540 Vdc. With a +/−270 Vdc, +/−540 Vdc, or equivalent system, beyond traditional generator neutral grounding, an impedance grounding scheme topology option interfaced at the system rectifier output midpoint is feasible. This type of impedance grounding approach is an important factor when compared to traditional generator neutral grounding, impacting electrical system performance characteristics and overcurrent protection coordination during feeder/load equipment ground faults.

For ground schemes that have the generator neutral floating with respect to ground, and the DC link of the rectifier is connected to ground through a resistor, there are some distinct advantages as a grounding approach. Namely, a fault of either an AC or DC aircraft feeder to the airframe will result in significantly reduced fault sourcing current levels and does not appreciably affect the DC output performance, allowing the system to continue to operate if desired. Reduced fault current with a high impedance ground fault condition has benefit for high voltage DC systems to mitigate potential equipment damage. However, since large amounts of current no longer flow during the fault condition, traditional current based feeder fault detection methods are no longer viable with this impedance grounding topology, so new methods need to be developed for fault isolation coordination.

Conventional generator neutral grounded systems and associated overcurrent fault detection techniques have been considered satisfactory for their intended purpose. However, there is a need for improved ground fault detection for power systems aboard aircraft utilizing high voltage DC generation/distribution applying a rectifier midpoint high impedance ground. This disclosure provides a solution for this need.

SUMMARY

A system includes a generator. Three AC feeders are connected for feeding AC output from the generator. A rectifier is electrically connected to the three AC feeders. The rectifier is configured to convert three phase AC from the three AC feeders of the generator into DC output to a load via a first DC feeder and a second DC feeder. A first resistor connects between a the first DC feeder and ground. A second resistor connects between the second DC feeder and ground. At least one of a first current sensor is operatively connected to detect current in the first DC feeder, a second current sensor is operatively connected to detect current in the second DC feeder, and/or a single third current sensor operatively connected to detect net common mode current of the first and second DC feeders. A controller is operatively connected to receive input from the at least one current sensor. The controller is configured to monitor for changes in common mode current based on the input from the at least one current sensor, and to determine presence of a fault if change in the common mode current exceeds a predetermined threshold.

The at least one current sensor is the single current sensor, wherein the controller is configured to determine presence of a fault if change in net common mode current exceeds a predetermined threshold. The controller can be configured to determine the fault is located in one of the DC feeders if the net common mode current is non-zero beyond the predetermined threshold. The controller can be configured to isolate the fault to a positive DC feeder if the net common mode current is positive, and to isolate the fault to a negative DC feeder if the net common mode current is negative. The controller can be configured to determine the fault is located in one of the AC feeders if the net common mode current follows an AC waveform. The controller can be configured to determine in which one of the AC feeders the fault is located based on phase angle of the net common mode current matching phase angle sensed in the AC feeder with the fault.

A DC filter can be operatively connected to each of the first and second DC feeders, and to ground, wherein the DC filter is configured to reduce noise in the first and second DC feeders. A DC load can be operatively connected to each of the first and second DC feeders, wherein the load is configured to utilized DC power from the first and second DC feeders. A second set of three AC feeders can connect a second three phases of the AC generator to a second rectifier, wherein the second rectifier includes two DC feeders operatively connected to the two DC feeders of the first rectifier. A second generator and at least one respective rectifier of the second generator can be included, wherein two DC feeders of the at least one respective rectifier of the second generator are connected to the first and second DC feeders, respectively, of the first rectifier.

The controller can be part of a generator control unit (GCU) or rectifier operatively connected to control the generator, part of a motor control unit (MCU) connected to control a motor connected to be powered as a load by the first and second DC feeders, part of a solid state power controller (SSPC), or a separate controller from the GCU rectifier, SSPC device, and MCU. The controller can be configured to take corrective action upon detection of a fault. The controller can be configured to de-excite the generator, disconnect the motor from power, provide an alternative source of power to the load as the corrective action, or isolate a distribution system load interfaced with the SSPC device or directly at load level.

A method includes detecting a net common mode current in a first DC feeder from a rectifier and a second DC feeder from the rectifier. The method includes determining a fault has occurred base on a change in the net common mode current that exceeds a predetermined threshold or, detecting common mode current in a distribution system SSPC (solid state power controller) interface or load interface and determining a fault has occurred base on a change in the net common mode current that exceeds a predetermined threshold.

The method can include determining the fault is located in one of the DC feeders if the value of the net common mode current is non-zero beyond the predetermined threshold, and if the fault is located in one of the DC feeders: isolating the fault to a positive DC feeder if the net common mode current is positive; and isolating the fault to a negative DC feeder if the net common mode current is negative. The method can include determining the fault is located in one of the AC feeders if the net common mode current follows a waveform, and if the fault is located in one of the AC feeders: determining which one of the AC feeders has the fault wherein phase angle of the net common mode current matches phase angle sensed in one of the AC feeder that has the fault.

These and other features of the systems and methods of the subject disclosure will become more readily apparent to those skilled in the art from the following detailed description of the preferred embodiments taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, preferred embodiments thereof will be described in detail herein below with reference to certain figures, wherein.

DETAILED DESCRIPTION OF THE PREFERRED EMBODIMENTS

Figure 1:
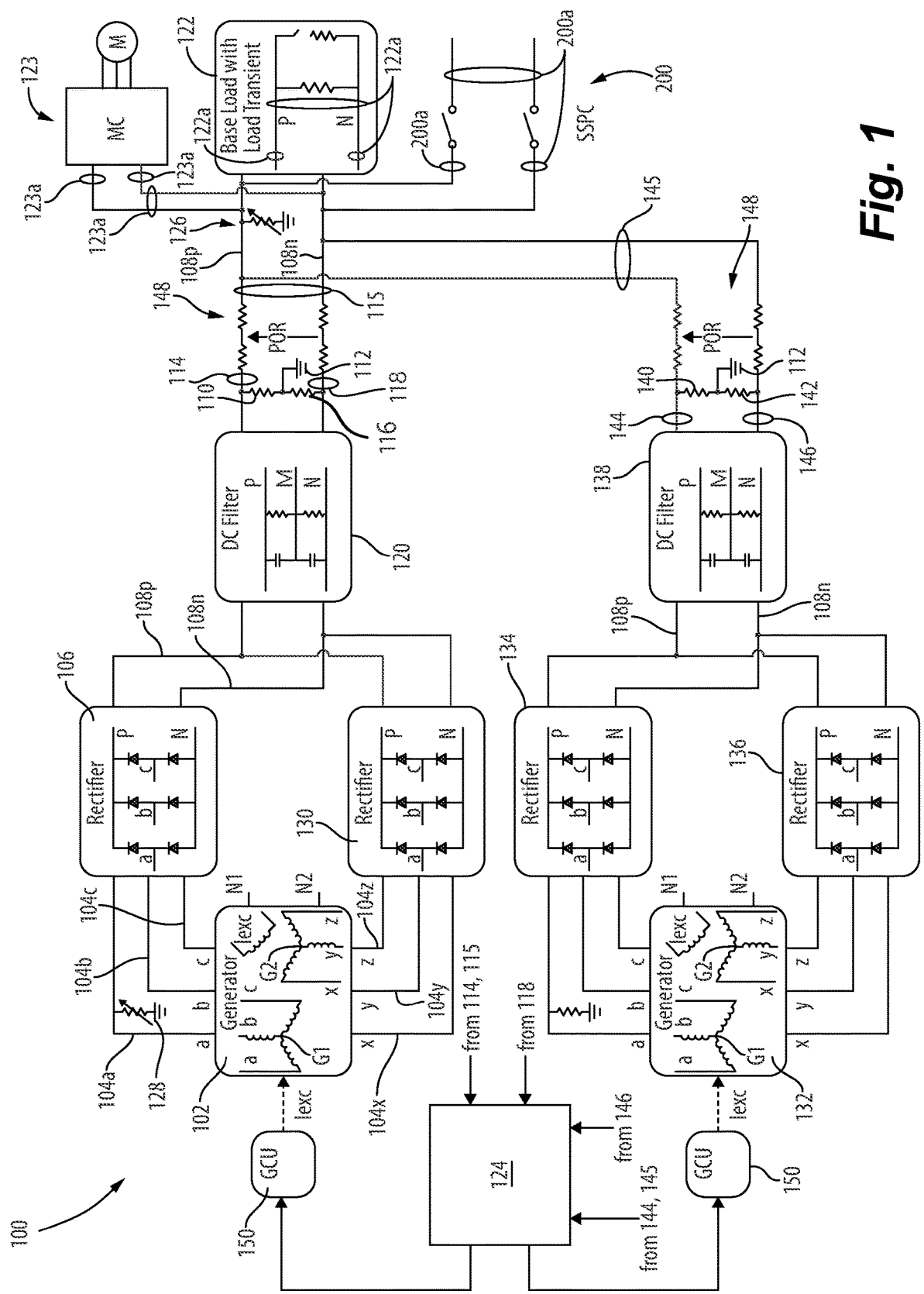
FIG. 1 is a schematic view of an embodiment of a system constructed in accordance with the present disclosure, showing the generators, rectifiers with high impedance ground, feeders, and load equipment interface with motor controller/motor and SSPC (solid state power controller) device distribution.
Figure 2:
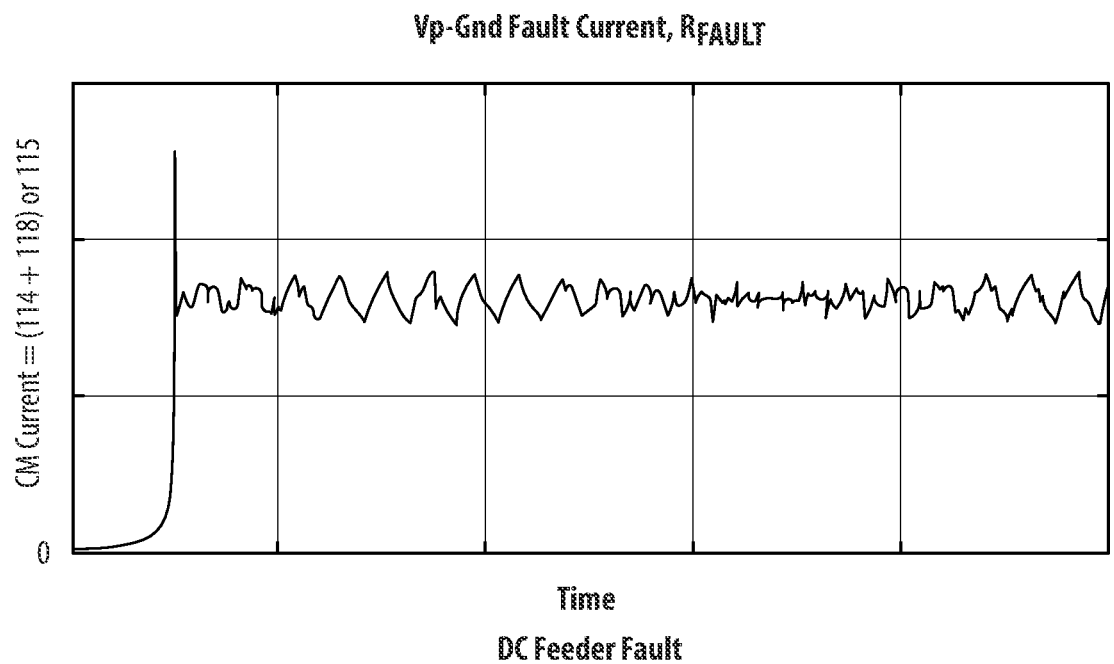
FIG. 2 is a graph showing a DC feeder fault apparent in the common mode current for the system of FIG. 1.

Reference will now be made to the drawings wherein like reference numerals identify similar structural features or aspects of the subject disclosure. For purposes of explanation and illustration, and not limitation, a partial view of an embodiment of a system in accordance with the disclosure is shown in FIG. 1 and is designated generally by reference character 100. Other embodiments of systems in accordance with the disclosure, or aspects thereof, are provided in FIGS. 2-3, as will be described. The systems and methods described herein can be used to detect AC feeder faults, DC feeder faults, and distribution ground faults using common mode current. By integrating common mode current sense points in both the generation system and distribution/load interface, protection timing can be staged to first allow distribution/load interface isolation of the anomalous condition, retaining the primary generation source. Should a fault persist beyond distribution/load interface protection timing, then the primary generation source can subsequently perform channel isolation. For added robustness of the common mode current fault detection, common mode voltage detection can be utilized in combination as an additional logic qualifier.

The system 100 includes a generator 102. Three AC feeders 104a, 104b, 104c are connected for feeding AC output from the generator 102. A rectifier 106 is electrically connected to the three AC feeders 104a, 104b, 104c. The rectifier 106 is configured to convert three phase AC from the three AC feeders 104a, 104b, 104c of the generator 102 into DC output to a load via a first DC feeder 108p and a second DC feeder 108n. A first resistor 110 connects between the DC feeder 108p and ground 112. A second resistor 116 connects between the second DC feeder 108n and ground 112.

A DC filter 120 is operatively connected to each of the first and second DC feeders 108p, 108n, and to ground 112, wherein the DC filter 120 is configured to reduce noise in the first and second DC feeders 108p, 108n. The resistors 110, 116 with current sensors 114, 115, and 118 can be integrated as part of an associated channel Rectifier/DC Filter combined unit.

DC loads 122 are operatively connected to each of the first and second DC feeders 108p, 108n, wherein the load 122 is configured to utilized DC power from the first and second DC feeders 108p, 108n and can host common mode current sense functionality 122a (with sensors on each feeder or as a single sensor coupling each feeder). DC load(s) can also be interfaced with SSPC (solid state power controller) +/−270 Vdc devices 200, which include integrated common mode current sense functionality 200a (e.g. with sensors on each feeder or as a single sensor coupling each feeder). Additional load equipment interface may include, motor controller/motor equipment 123, also including integrated common mode current sense functionality 123a (e.g. with sensors on each feeder or as a single sensor coupling each feeder).

The system 100 includes one or more current sensors 114, 115, and/or 118. The first current sensor 114 is operatively connected to detect current in the first DC feeder 108p. The second current sensor 118 is operatively connected to detect current in the second DC feeder 108n. The current sensor(s) 114, 115, 118 is/are operatively connected to sense net common mode current in both the first and second DC feeders 108p, 108n. For example, common mode (CM) current can be determined from the sum of current detected from sensors 114 and 118. It is also possible to detect CM current directly using sensor 115, which will similarly detect the net current of the feeders 108p, 108n. Similar common mode current can be determined at the distribution/load equipment interface(s) 122a, 200a, 123a labeled in FIG. 1.

The controller 124 is operatively connected to receive input from the sensors 114, 115, 118. The controller 124 is configured to determine presence of a fault DC feeder to ground fault 126 or AC feeder to ground fault 128 (or in load interface points in the system 100) if change in net common mode current exceeds a predetermined threshold. The controller 124 can determine the fault 126 is located in one of the DC feeders if the net common mode current shifts to be non-zero positive or negative with sufficient magnitude beyond a predetermined threshold, i.e. the common mode current shown in the graph of FIG. 2 may oscillate, but is always on the same side of zero. The controller 124 is configured to isolate the fault to a positive DC feeder 108p if the net common mode current is positive, and to isolate the fault to a negative DC feeder 108n if the net common mode current is negative (and load interface points may isolate to associated load equipment/wiring). FIG. 1 shows the fault 126 located on the positive DC feeder 108p, but could be located on the negative DC feeder 108n as well (or at load interfaces). A ground fault located downstream of SSPC devices, motor controller/motor interface, or at a load can allow for local equipment controller isolation prior to a generation channel protection time-out, thereby keeping the channel on-line.

Figure 3:
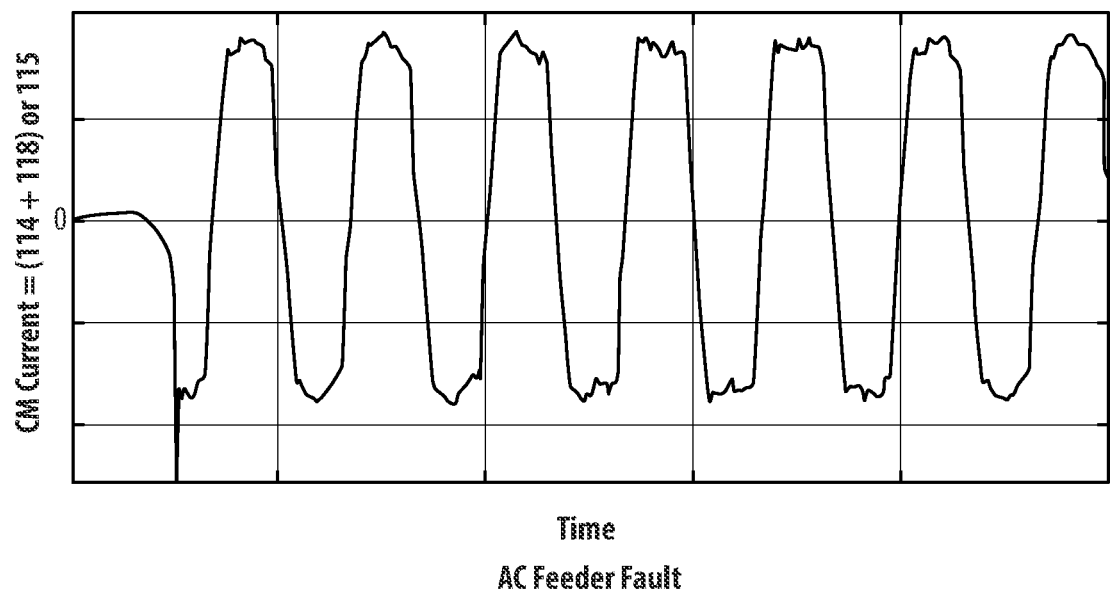
FIG. 3 is a graph showing an AC feeder fault apparent in the common mode current for the system of FIG. 1.

The controller 124 can determine the fault 128 is located in one of the AC feeders if the net common mode current determined from the sensors 114, 115, and/or 118 follows a waveform, i.e. crosses back and forth over zero with sufficient magnitude beyond a predetermined threshold as shown in the graph of FIG. 3. The controller 124 can determine in which one of the AC feeders the fault 128 is located based on phase angle of the net common mode current matching phase angle sensed in the AC feeder with the fault 128. The fault 128 is shown schematically in FIG. 1 in the feeder 104a, but it could be in the other two AC feeders 104b, 104c as well.

With ongoing reference to FIG. 1, any suitable number of generators, feeders, rectifiers, filters can be included (channels may be paralleled, which provides further benefit with a rectifier midpoint impedance ground topology, as fault current will be minimized and generator neutral switching is not required to mitigate generator neutral circulating current). A second set of three AC feeders 104x, 104y, 104z connect a second three phases of the AC generator 102 to a second rectifier 130. The second rectifier 130 includes two DC feeders 108p, 108n operatively connected to the two DC feeders of the first rectifier 106, i.e. the feeders 108p and 108n are connected in parallel for the two rectifiers 106 and 130, which can share the same DC filter 120.

A second generator 132 and at least respective rectifiers 134, 136 of the second generator 132 can be included, wherein two DC feeders 108p, 108n of the at rectifiers 134, 136 of the second generator 132 are connected to the first and second DC feeders, respectively, of the first rectifier 106, 130, i.e. the respective DC feeders 108p, 108n are all connected in parallel for all four rectifiers 106, 130, 134, 136. The six respective AC feeders of the second generator 132 are not numbered, for sake of clarity in the drawing, but are connected to respective rectifiers 134, 136 in the same manner described above for generator 102. The rectifiers 134, 136 are operatively connected to their own DC filter 138 in the same manner described above for rectifiers 106, 130. There can be additional resistors 140, 142 connected to ground 112, with respective current sensors 144, 145 146 all connected to the feeders 108p, 108n, and to the controller 124 in the same manner as for those resistors 110, 116 described above. Also, the resistors 140 and 142 with current sensors 144 and 146 can be integrated as part of an associated channel Rectifier/DC Filter combined unit. Each of the generators 102, 132 can have a respective POR (point of regulation) 148 between its respective DC filter 120, 138 and the load 122. For example, the GCU (generator control unit) can regulate the POR to +/−270 Vdc (540 Vdc across feeders), but other voltage levels are conceivable, depending on application, such as +/−540 (1080 Vdc across feeders).

The controller 124 can be a separate unit, or can be part of one or more a generator control units (GCUs) 150 operatively connected to control the generators 102, 132. It is also contemplated that the controller 124 can be part of rectifiers 106, 130, 134, 136 or a motor control unit (MCU) 123 connected to control a motor connected to be powered as a load 122 by the first and second DC feeders 108p,108n. A controller 124 can also be part of SSPC (solid state power controller) devices 200 for common mode detection in the distribution system. The controller 124 is configured to take corrective action upon detection of a fault 126, 128. For example, the controller 124 can de-excite the affected the generator 102, 132, disconnect the motor (e.g. in load 122) from power, isolate an SSPC 200 distribution load, provide an alternative source of power to the load 122 as the corrective action, alert other systems or users of the fault, or the like.

Systems and methods as disclosed herein provide potential benefits for high impedance ground applications. This type of high impedance ground topology facilitates good system power quality performance, including minimal common mode (CM) voltage during normal operation. Additionally, the high impedance ground topology can enable quick recovery from system faults, along with limiting current flow to ground at minimal levels in the presence of a single fault to ground—allowing for potential continued operation. The minimal fault current flow with high voltage DC rectifier midpoint impedance ground reduces equipment damage risk.

Systems and methods as disclosed herein provide potential benefits for common mode (CM) current based feeder fault detection. By utilizing small sensitive common mode current sensors, dedicated large AC or DC current sensors can potentially be eliminated, lowering aircraft weight/cost. Additionally, the ability to isolate faults to different feeders or distribution load equipment based on a CM current signature enables an ability to isolate rail to ground faults with staged timing between distribution load interfaces and the generation system. Using multiple controllers in different points of the system with CM Current sensing facilitates isolation of the rail to ground fault at the remotest point in the System generation/distribution network.

The methods and systems of the present disclosure, as described above and shown in the drawings, provide for detecting AC feeder faults and DC feeder faults using common mode current. While the apparatus and methods of the subject disclosure have been shown and described with reference to preferred embodiments, those skilled in the art will readily appreciate that changes and/or modifications may be made thereto without departing from the scope of the subject disclosure.

What is claimed is:

1. A system comprising:
   a generator;
   three alternating current (AC) feeders configured to feed three phase AC output from the generator;
   a rectifier electrically connected to the three AC feeders, the rectifier configured to convert the three phase AC output from the three AC feeders into direct current (DC) output to a load via a first DC feeder and a second DC feeder;
   a first resistor connecting between the first DC feeder and ground;
   a second resistor connecting between the second DC feeder and ground;
   at least one current sensor operatively connected to detect net common mode current of the first and second DC feeders; and
   a controller operatively connected to receive input from the at least one current sensor, wherein the controller is configured to monitor for changes in the net common mode current based on the input from the at least one current sensor and to determine a presence of a fault if a change in the net common mode current exceeds a predetermined threshold;
   wherein the controller is configured to:
      determine the fault is located in one of the DC feeders if the net common mode current is non-zero beyond the predetermined threshold; and isolate the fault to a positive one of the DC feeders if the net common mode current is positive and to a negative one of the DC feeders if the net common mode current is negative.

2. The system as recited in claim 1, wherein the at least one current sensor is a single current sensor.

3. The system as recited in claim 1, further comprising a DC filter operatively connected to each of the first and second DC feeders and to ground, wherein the DC filter is configured to reduce noise in the first and second DC feeders.

4. The system as recited in claim 1, further comprising the load operatively connected to each of the first and second DC feeders, wherein the load is configured to utilize DC power from the first and second DC feeders.

5. The system as recited in claim 1, wherein;
the three AC feeders are a first set of AC feeders connecting a first three phases of the generator to the rectifier;
the rectifier is a first rectifier;
the system further comprises a second set of three AC feeders connecting a second three phases of the generator to a second rectifier; and
the second rectifier includes two DC feeders operatively connected to the first and second DC feeders of the first rectifier.

6. The system as recited in claim 5, further comprising a second generator and at least one respective rectifier of the second generator, wherein two DC feeders of the at least one respective rectifier of the second generator are connected to the first and second DC feeders, respectively, of the first rectifier.

7. The system as recited in claim 1, wherein the controller is one of:
part of a generator control unit (GCU) or the rectifier operatively connected to control the generator;
part of a motor control unit (MCU) connected to control a motor connected to be powered as the load by the first and second DC feeders;
part of a solid state power controller (SSPC) device; or
a separate controller from the GCU, rectifier, SSPC device, and MCU.

8. The system as recited in claim 7, wherein the controller is configured to take corrective action upon detection of the fault.

9. The system as recited in claim 8, wherein the controller is configured to at least one of:
de-excite the generator;
disconnect the motor from power;
provide an alternative source of power to the load; or
isolate a distribution system load interfaced with the SSPC device or directly at load level.

10. A system comprising:
a generator;
three alternating current (AC) feeders configured to feed three phase AC output from the generator;
a rectifier electrically connected to the three AC feeders, the rectifier configured to convert the three phase AC output from the three AC feeders into direct current (DC) output to a load via a first DC feeder and a second DC feeder;
a first resistor connecting between the first DC feeder and ground;
a second resistor connecting between the second DC feeder and ground;
at least one current sensor operatively connected to detect net common mode current of the first and second DC feeders; and
a controller operatively connected to receive input from the at least one current sensor, wherein the controller is configured to monitor for changes in the net common mode current based on the input from the at least one current sensor and to determine a presence of a fault;
wherein the controller is configured to determine the fault is located in one of the AC feeders if the net common mode current follows an AC waveform.

11. The system as recited in claim 10, wherein the controller is configured to determine the fault is located in one of the DC feeders if the net common mode current is non-zero beyond a predetermined threshold.

12. The system as recited in claim 11, wherein the controller is configured to isolate the fault to a positive DC feeder if the net common mode current is positive and to isolate the fault to a negative DC feeder if the net common mode current is negative.

13. The system as recited in claim 10, wherein the controller is configured to determine in which one of the AC feeders the fault is located based on a phase angle of the net common mode current matching a phase angle sensed in the AC feeder with the fault.

14. A method comprising:
detecting a net common mode current in a first direct current (DC) feeder from a rectifier and a second DC feeder from the rectifier, the rectifier electrically connected to three alternating current (AC) feeders that feed AC output from a generator;
determining that a fault has occurred based on a change in the net common mode current; and
determining that the fault is located in one of the AC feeders if the net common mode current follows an AC waveform.

15. The method as recited in claim 14, further comprising:
determining that the fault is located in one of the DC feeders if the net common mode current is non-zero beyond a predetermined threshold.

16. The method of claim 15, further comprising:
if the fault is located in one of the DC feeders:
isolating the fault to a positive DC feeder if the net common mode current is positive; and
isolating the fault to a negative DC feeder if the net common mode current is negative.

17. The method of claim 14, further comprising:
if the fault is located in one of the AC feeders, determining in which one of the AC feeders the fault is located based on a phase angle of the net common mode current matching a phase angle sensed in the AC feeder with the fault.

18. The method of claim 14, wherein:
the three AC feeders are a first set of AC feeders connecting a first three phases of the generator to the rectifier;
the rectifier is a first rectifier;
a second set of three AC feeders connects a second three phases of the generator to a second rectifier; and
the second rectifier includes two DC feeders operatively connected to the first and second DC feeders of the first rectifier.

19. The method as recited in claim 14, wherein:
a second generator includes at least one respective rectifier; and two DC feeders of the at least one respective rectifier of the second generator are connected to the first and second DC feeders, respectively, of the rectifier.

20. The method as recited in claim 14, wherein the net common mode current is detected using a single current sensor.

* * * * *